US012652031B2

(12) United States Patent
Miyano

(10) Patent No.: US 12,652,031 B2
(45) Date of Patent: Jun. 9, 2026

(54) APPARATUSES AND METHODS FOR DELAY-LOCKED LOOP CLOCK CONTROL

(71) Applicant: MICRON TECHNOLOGY, INC., Boise, ID (US)

(72) Inventor: Kazutaka Miyano, Sagamihara (JP)

(73) Assignee: MICRON TECHNOLOGY, INC., Boise, ID (US)

( * ) Notice: Subject to any disclaimer, the term of this patent is extended or adjusted under 35 U.S.C. 154(b) by 147 days.

(21) Appl. No.: 18/775,547

(22) Filed: Jul. 17, 2024

(65) Prior Publication Data

US 2025/0202466 A1     Jun. 19, 2025

Related U.S. Application Data

(60) Provisional application No. 63/612,201, filed on Dec. 19, 2023.

(51) Int. Cl.
H03K 5/133 (2014.01)
H03K 5/135 (2006.01)

(52) U.S. Cl.
CPC ............. H03K 5/133 (2013.01); H03K 5/135 (2013.01)

(58) Field of Classification Search
None
See application file for complete search history.

(56) References Cited

U.S. PATENT DOCUMENTS

| | | | | |
|---|---|---|---|---|
| 9,543,967 B2 * | 1/2017 | Takahashi | ............. | H03L 7/0814 |
| 10,110,240 B1 * | 10/2018 | Satoh | ...................... | H03L 7/193 |
| 11,211,103 B1 * | 12/2021 | Mazumder | ........... | G11C 7/1018 |
| 12,498,751 B2 * | 12/2025 | Cho | .......................... | G06F 1/06 |
| 12,505,875 B2 * | 12/2025 | Waldrop | ............. | G11C 11/4093 |
| 2011/0241742 A1 * | 10/2011 | Kim | ..................... | G11C 7/1066 |
| | | | | 327/158 |
| 2014/0177361 A1 * | 6/2014 | Kitagawa | ............... | G11C 7/222 |
| | | | | 365/194 |
| 2019/0074841 A1 * | 3/2019 | Satoh | ................... | H03L 7/0992 |

* cited by examiner

*Primary Examiner* — Cassandra F Cox
(74) *Attorney, Agent, or Firm* — Dorsey & Whitney LLP

(57) ABSTRACT

An example apparatus includes a clock input circuit to provide an internal clock signal based on an external clock signal, and a command decoder configured to provide a command signal based on a received command. The example apparatus further includes an internal clock generator having DLL circuit to receive the internal clock signal and the command signal and to provide a phase-adjusted internal clock signal based on the internal clock signal. In response to receipt of the command signal, the DLL circuit enables provision of the phase-adjusted internal clock signal to an input/output circuit and stops provision of the phase-adjusted internal clock signal after a count of clock cycles of the internal clock signal exceeds a predetermined count value. The predetermined count value is based on a signal propagation time of the internal clock signal from the output of the internal clock circuit to an output of the input/output circuit.

20 Claims, 8 Drawing Sheets

APPARATUSES AND METHODS FOR DELAY-LOCKED LOOP CLOCK CONTROL

CROSS-REFERENCE TO RELATED APPLICATION

This application claims the filing benefit of U.S. Provisional Application No. 63/612,201, filed Dec. 19, 2023. This application is incorporated by reference herein in its entirety and for all purposes.

BACKGROUND

High data reliability, high speed memory access, lower power consumption and reduced chip size are features that are demanded from semiconductor memory. To achieve higher memory access speed, operational timing in the semiconductor memory is adjusted using a clock signal as a reference signal. A semiconductor device may generate internal clock signals, and the faster the clock signal, the more power that may be required to continuously generate the clock signal. There may be opportunities to decrease power consumption by more tightly controlling the windows a clock signal is generated.

DETAILED DESCRIPTION

Certain details are set forth below to provide a sufficient understanding of embodiments of the disclosure. However, it will be clear to one having skill in the art that embodiments of the disclosure may be practiced without these particular details. Moreover, the particular embodiments of the present disclosure described herein are provided by way of example and should not be used to limit the scope of the disclosure to these particular embodiments.

This application describes examples of semiconductor devices including delay-locked loop (DLL) circuitry that more tightly controls windows during which an internal clock signal may be generated. When an external clock signal is received at a semiconductor device, the clock phase of internal clock signals based on the external clock signal may be delayed because of the inherent delay of the components of the semiconductor device. At high operating speeds, distortions in a clock signal duty cycle may adversely affect the functioning of the semiconductor device. To accommodate these delays and distorting effects, a clock path may include a delay circuit. The clock phase may be adjusted to match the phase of the external clock using DLL circuit.

A DLL circuit may include a delay line that includes a series of adjustable delays that are configured to align a phase of an input signal with a phase of an output signal. When a power is turned on, the DLL circuit may perform initialization of a measurement of a phase difference between the input clock and a clock used at downstream circuitry. During the initialization, the DLL circuit may include a detector that detects a number of cycles that is longer than the inherit delay, and may accordingly adjust a delay of the delay line to match a phase of the input clock signal.

The adjusted internal clock signal may be provided to downstream circuitry to control timing of certain operations. To limit power consumption, circuitry of the semiconductor device may control windows when the internal clock signal is generated or provided to the downstream circuitry. Due to timing variance between different semiconductor devices, these windows may be many clock cycles longer than is required to complete the desired operation. Thus, the DLL circuit may include additional circuitry that is configured to measure a length of an entire delay path, and to more tightly control the window during which the internal clock signal is generated. By more tightly controlling the window, the semiconductor device may consume less power than implementations where the windows are longer.

Figure 1:
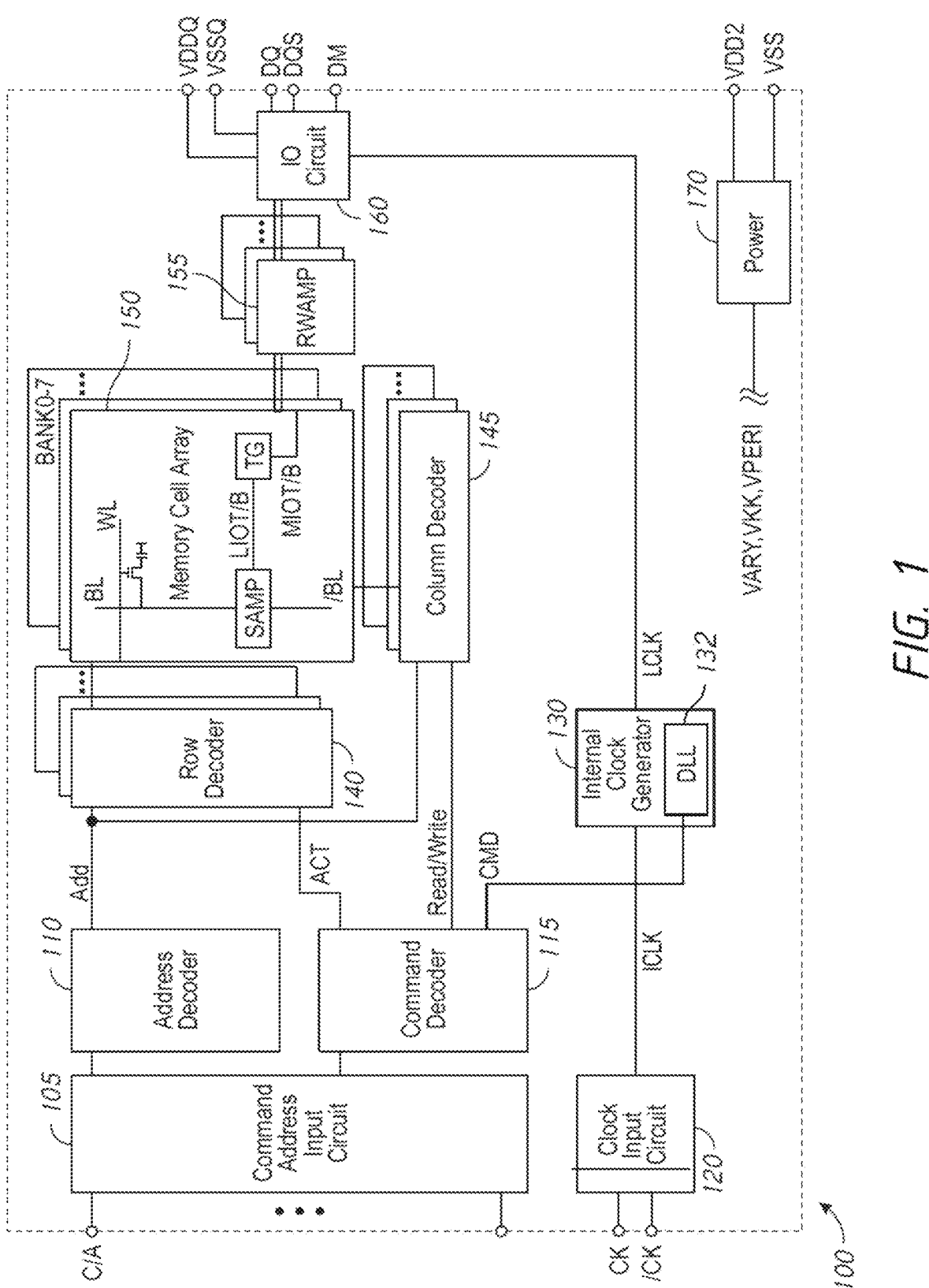
FIG. 1 illustrates a schematic block diagram of a semiconductor device 100 in accordance with an embodiment of the present disclosure.

FIG. 1 illustrates a schematic block diagram of a semiconductor device 100 in accordance with an embodiment of the present disclosure. The semiconductor device 100 includes a memory die. The memory die may include a command/address input circuit 105, an address decoder 110, a command decoder 115, a clock input circuit 120, internal clock generator 130, row decoder 140, column decoder 145, memory arrays 150, read/write amplifiers 155, I/O circuit 160, and power circuit 170.

In some embodiments, the semiconductor device 100 may include, without limitation, a dynamic random-access memory (DRAM) device, such as double data rate (DDR) DDR4, DDR5, low power DDR (LPDDR), Graphics DDR (GDDR) GDDR5, GDDR5X, GDDR6, integrated into a single semiconductor chip, for example. The die may be mounted on an external substrate, for example, a memory module substrate, a mother board or the like. The semiconductor device 100 may further include a memory array 150. The memory array 150 includes a plurality of banks, each bank including a plurality of word lines WL, a plurality of bit lines BL, and a plurality of memory cells MC arranged at intersections of the plurality of word lines WL and the plurality of bit lines BL. The selection of the word line WL is performed by a row decoder 140 and the selection of the bit line BL is performed by a column decoder 145. Sense amplifiers (SA) are located for their corresponding bit lines BL and connected to at least one respective local I/O line (LIOT/B), which is in turn coupled to a respective one of at least two main I/O line pairs (MIOT/B), via transfer gates (TG), which function as switches.

The semiconductor device 100 may employ a plurality of external terminals that include address and command terminals coupled to command/address bus (C/A), clock terminals CK and/CK, data terminals DQ, DQS, and DM, power supply terminals VDD2, VSS, VDDQ, and VSSQ.

The command/address terminals may be supplied with an address signal and a bank address signal from outside. The address signal and the bank address signal supplied to the address terminals are transferred, via the command/address input circuit 105, to an address decoder 110. The address decoder 110 receives the address signal and decodes the address signal to provide decoded address signal ADD. The ADD signal includes a decoded row address signal and a decoded column address signal. The decoded row address signal is provided to the row decoder 140, and a decoded column address signal is provided to the column decoder 145. The address decoder 110 also receives the bank address signal and supplies the bank address signal to the row decoder 140, the column decoder 145.

The command/address terminals may further be supplied with a command signal from outside, such as, for example, a memory controller. The command signal may be provided, via the C/A bus, to the command decoder 115 via the command/address input circuit 105. The command decoder 115 decodes the command signal to generate various internal commands that include a row command signal ACT to select a word line and a column command signal Read/Write, such as a read command or a write command, to select a bit line, and a test mode signal.

Accordingly, when a read command is issued and a row address and a column address are timely supplied with the read command, read data is read from a memory cell in the memory array 150 designated by these row address and column address. The read data DQ is output to outside from the data terminals DQ (data), DQS (data strobe), and DM (data mask) via read/write amplifiers 155 and an input/output circuit 160. Similarly, when the write command is issued and a row address and a column address are timely supplied with this command, and then write data is supplied to the data terminals DQ, DQS, DM, the write data is received by data receivers in the input/output circuit 160, and supplied via the input/output circuit 160 and the read/write amplifiers 155 to the memory array 150 and written in the memory cell designated by the row address and the column address.

Turning to the explanation of the external terminals included in the semiconductor device 100, the clock terminals CK and/CK are supplied with an external clock signal and a complementary external clock signal, respectively. The external clock signals (including complementary external clock signal) may be supplied to a clock input circuit 105. The clock input circuit 105 may receive the external clock signals to generate an internal clock signal ICLK. The internal clock signal ICLK is supplied to an internal clock generator 130 and thus a phase controlled internal clock signal LCLK is generated based on the received internal clock signal ICLK. The phase controlled internal clock signal LCLK is supplied to the input/output circuit 160 and is used as a timing signal for determining an output timing of read data.

In some examples, the internal clock generator 130 may include a DLL circuit 132. The DLL circuit 132 may include a delay line that includes a series of adjustable delays that are configured to align a phase of an input signal with a phase of an output signal. When a power is turned on, the DLL circuit may perform initialization of the measurement of a phase difference between the ICLK signal and the LCLK signal. During the initialization, the DLL circuit 132 may include a detector that detects a number of cycles that is longer than the inherent delay, and may accordingly adjust a delay of the delay line to match a phase of the input clock signal. Provision of the LCLK signal may be based on a command signal CMD received from the command decoder 115. However, operation solely based on the CMD signal may result in generation of the LCLK signal for long windows beyond the corresponding operation using the LCLK signal. Thus, the DLL circuit 132 may include circuit that more tightly controls windows during which the LCLK signal by measuring a total number of cycles of the ICLK signal it takes for a signal to propagate along the propagation path the I/O circuit 160. Using this measurement, the DLL circuit 132 may control when provision of the LCLK signal is stopped based on this count of clock cycles. By more tightly controlling the window, the semiconductor device 100 may consume less power than implementations where the windows are set to a fixed time or number of clock cycles regardless of device.

The power supply terminals are supplied with power supply potentials VDD and VSS. These power supply potentials VDD2 and VSS are supplied to an internal voltage generator circuit 170. The internal voltage generator circuit 170 generates various internal potentials VARY, VKK, VPERI, and the like based on the power supply potentials VDD2 and VSS. The internal potential VARY is mainly used in the sense amplifiers included in the memory array 150, the internal potential VKK is mainly used in the row decoder 140, and the internal potential VPERI is used in many other circuit blocks.

The power supply terminals are also supplied with power supply potentials VDDQ and VSSQ. These power supply potentials VDDQ and VSSQ are supplied to the input/output circuit 160. The power supply potentials VDDQ and VSSQ are typically the same potentials as the power supply potentials VDD2 and VSS, respectively. However, the dedicated power supply potentials VDDQ and VSSQ are used for the input/output circuit 160 so that power supply noise generated by the input/output circuit 160 does not propagate to the other circuit blocks.

Figure 2:
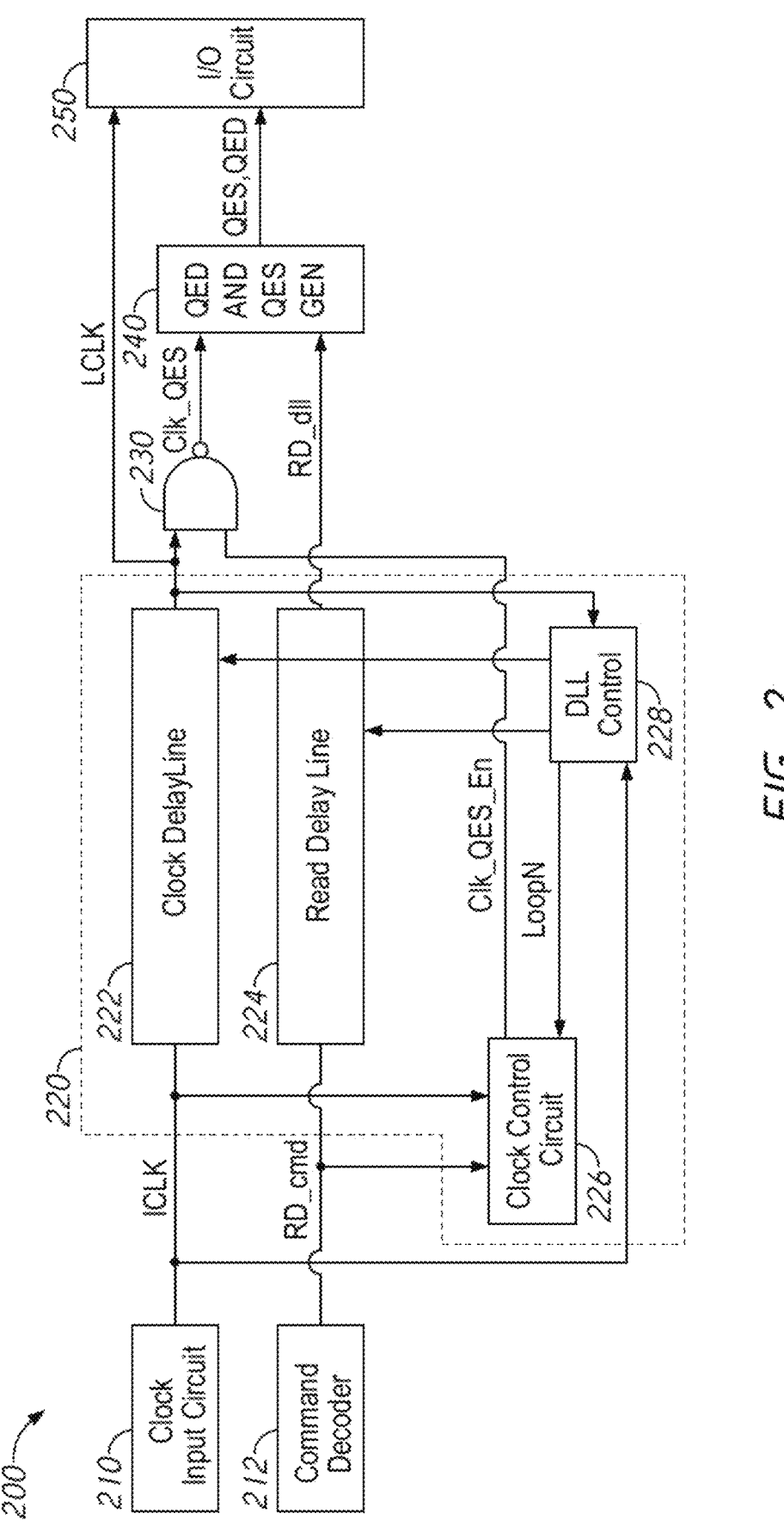
FIG. 2 is a block diagram of a semiconductor device 200 including a DLL circuit 220 in accordance with an embodiment of the present disclosure.

FIG. 2 is a block diagram of a semiconductor device 200 including a DLL circuit 220 in accordance with an embodiment of the present disclosure. The semiconductor device 100 of FIG. 1 may implement the semiconductor device 200, in some examples. The semiconductor device 200 may include a clock input circuit 210, a command decoder 212, the DLL circuit 220, a clock enable circuit 230, and a QED and QES generation circuit 240, and an input/output circuit 250.

The clock input circuit clock input circuit 210 may receive an external clock signal and may generate an internal clock signal ICLK based on the external clock signals. The internal clock signal ICLK is supplied to an internal clock generator (e.g., the DLL circuit 220, the clock enable circuit 230, and the QED and QES generation circuit 240) and thus a phase controlled internal clock signal LCLK is generated based on the received internal clock signal ICLK. The phase controlled internal clock signal LCLK is supplied to the input/output circuit input/output circuit 250 and is used as a timing signal for determining an output timing of read data.

The command signal may be provided, via a C/A bus, to the command decoder command decoder 212. The command decoder command decoder 212 decodes the command signal to generate various internal commands that include a row command signal to select a word line and a column command signal RD_cmd, such as a read command, to select a bit line. Accordingly, when a read command is issued and a row address and a column address are timely supplied with the read command, read data (not shown) is read from a memory cell in a memory array (not shown) designated by these row address and column address and is provided to the input/output circuit input/output circuit 250 to support output of read data.

The DLL circuit 220 may receive the ICLK signal and the RD_cmd signal. The DLL circuit 220 may include a clock delay line 222, a read delay line 224, a DLL control circuit 228, and a clock control circuit 226. The clock delay line 222 and the read delay line 224 may each include a series of adjustable delays that are configured to align a phase of the ICLK signal with a phase of the LCLK signal. The clock delay line 222 may a delayed version of the ICLK signal to an output as the LCLK signal and the read delay line 224 may provide a delayed version of the RD_cmd to an output as the RD_DLL signal. When a power is turned on, the DLL control circuit 228 may perform initialization of the measurement of a phase difference between the ICLK signal and the LCLK signal. During the initialization, the DLL control circuit 228 may include a detector that detects a number of cycles of the LCLK that is longer than the inherent delay, and may accordingly adjust a delay of the clock delay line 222 and the read delay line 224 to match a phase of the ICLK signal.

In parallel with determining a phase alignment of the ICLK and the LCLK, the DLL control circuit 228 of the DLL circuit 220 may measure a total number of cycles of the ICLK signal it takes for the ICLK propagate along the propagation path to the input/output circuit input/output circuit 250. To perform this measurement, the DLL control circuit 228 may receive the ICLK signal and may begin counting clock cycles. In parallel, the ICLK signal may propagate through the clock delay line 222 to the DLL control circuit 228. The DLL control circuit 228 may include a replica delay circuit that mimics a delay for a transmission path of the ICL signal from the DLL circuit 220 to one of a plurality of data input/output terminals of the input/output circuit input/output circuit 250. Once the clock signal propagates through the DLL control circuit 228, the DLL control circuit 228 may provide a LoopN signal having a value indicating number of clock cycles it takes for the ICLK signal propagate through the clock delay line 222 and the DLL control circuit 228.

Using the LoopN signal, the clock control circuit 226 may control provision of the clock data output strobe (QES) enable signal Clk_QES_En based on the RD_cmd and the count value. That is, the clock control circuit 226 may set the Clk_QES_En signal to enable in response to the RD_cmd signal and may set the Clk_QES_En to disable after a number of clock cycles of the ICLK exceeds the count value from the time the RD_cmd signal is received. By more tightly controlling the window, the semiconductor device 200 may consume less power than implementations where the windows are set to a fixed time or number of clock cycles regardless of device.

The clock enable circuit 230 may receive the LCLK signal and the Clk_QES_En signal. Using NAND logic, when the Clk_QES_En signal is enabled, the clock enable circuit 230 may provide the LCLK signal to the QED and QES generation circuit 240 as the Clk_QES signal. When the Clk_QES_En signal is disabled, the clock enable circuit 230 may set the Clk_QES signal to a constant, non-periodic value. Thus, the QES and QED signals are only enabled as long as they need to be to complete the read command operation. By more tightly controlling this window, the semiconductor device 200 may consume less power than implementations where the windows are set to a fixed time or number of clock cycles regardless of device.

The QED and QES generation circuit 240 may control operation of the data output enable signal QED and the data output strobe signal QES based on the RD_dll and the Clk_QES signals. The input/output circuit 250 may provide read data at an output (not shown) in response to the LCLK signal and the QES and QED signals.

In operation at an initial power-up, the DLL control circuit 228 of the DLL circuit 220 may begin counting clock cycles of the ICLK signal while the ICLK signal propagates through the clock delay line 222 and the DLL control circuit 228. In response to the ICLK signal propagating through the DLL control circuit 228, the DLL control circuit 228 may set a LoopN signal to a value indicating a total number of clock cycles for the ICLK signal to propagate through the DLL circuit 220 to an output terminal of the input/output circuit input/output circuit 250, and may provide the LoopN signal to the clock control circuit 226.

In parallel, the DLL control circuit 228 may perform initialization of the measurement of a phase difference between the ICLK signal and the LCLK signal. During the initialization, the DLL control circuit 228 may include a detector that detects a number of cycles of the LCLK that is longer than the inherent delay, and may accordingly adjust a delay of the clock delay line 222 and the read delay line 224 to match a phase of the ICLK signal. The clock delay line 222 and the read delay line 224 may each include a series of adjustable delays that are configured to align a phase of the ICLK signal with a phase of the LCLK signal. The clock delay line 222 may a delayed version of the ICLK signal to an output as the LCLK signal and the read delay line 224 may provide a delayed version of the RD_cmd to an output as the RD_dll signal.

When the DLL circuit 220 is initialized and the LoopN signal is established and the DLL circuit 220 is in a phase-locked state, the CLK input circuit clock input circuit 210 may receive an external clock signal and the command decoder command decoder 212 may receive a read command. In response, the CLK input circuit clock input circuit 210 may provide the LCLK signal clock input circuit 210 and the command decoder may provide the RD_cmd signal. In response to receipt of the RD_cmd signal and the ICLK signal, the clock control circuit 226 may control provision of the clock data output strobe (QES) enable signal Clk_QES_En. That is, the clock control circuit 226 may set the Clk_QES_En signal to enable in response to the RD_cmd signal and may set the Clk_QES_En to disable after a number of clock cycles of the ICLK exceeds the LoopN count value from the time the RD_cmd signal is received.

The clock enable circuit 230 may provide the LCLK signal to the QED and QES generation circuit 240 as the Clk_QES signal when the Clk_QES_En signal is enabled, and may set the Clk_QES signal to a constant, non-periodic value when the Clk_QES_En signal is disabled. The QED and QES generation circuit 240 may control operation of the data output enable signal QED and the data output strobe signal QES based on the RD_dll and the Clk_QES signals. The input/output circuit 250 may provide read data at an output (not shown) in response to the LCLK signal and the QES and QED signals.

Figure 3:
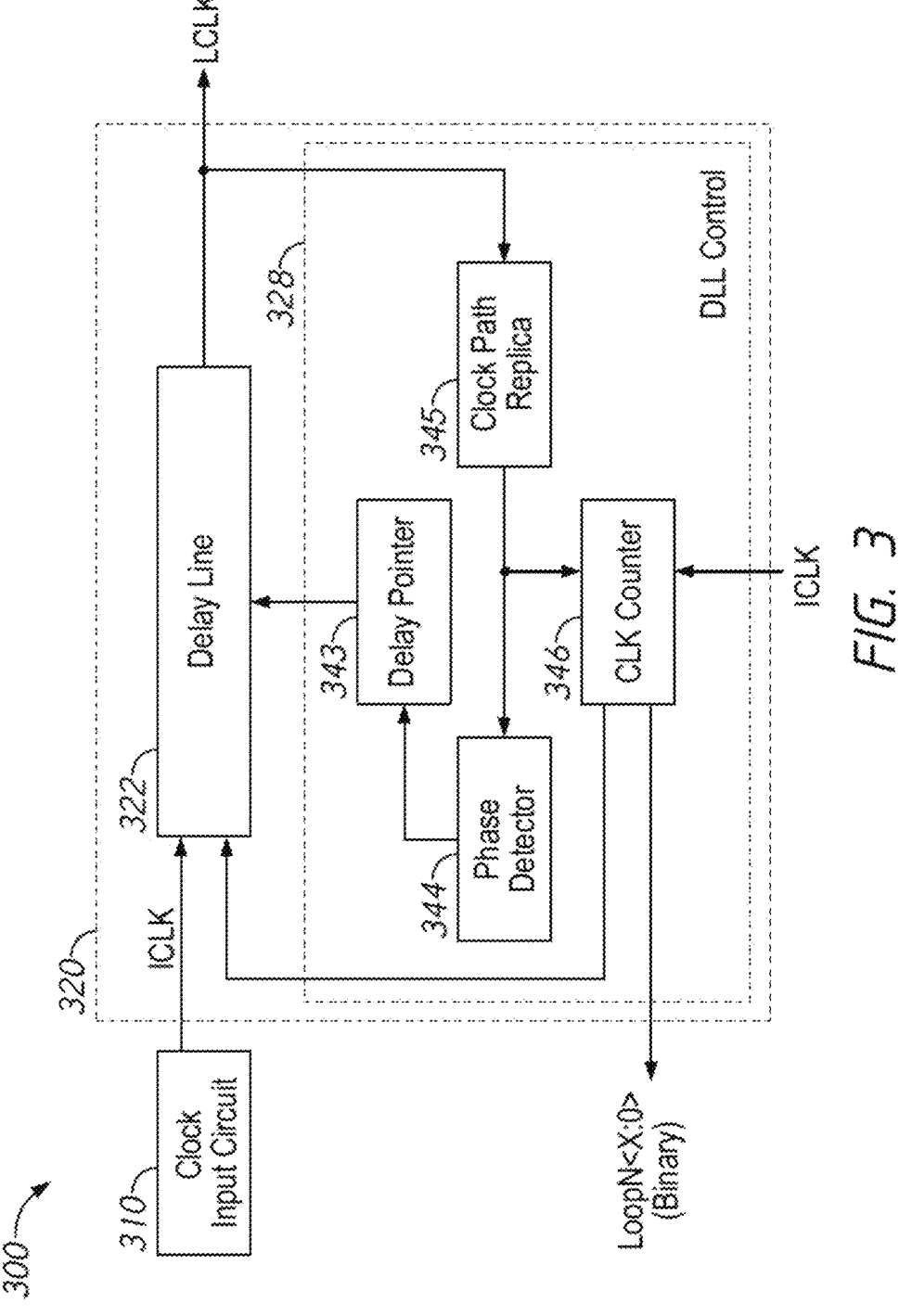
FIG. 3 is a block diagram of a semiconductor device 300 including a DLL circuit 320 in accordance with an embodiment of the present disclosure.

FIG. 3 is a block diagram of a semiconductor device 300 including a DLL circuit 320 in accordance with an embodiment of the present disclosure. The semiconductor device 100 of FIG. 1 and/or the semiconductor device 200 of FIG. 2 may implement the semiconductor device 300, in some examples. The semiconductor device 300 may include a clock input circuit 310 and a DLL circuit 320.

The clock input circuit clock input circuit 310 may receive an external clock signal and may generate an internal clock signal ICLK based on the external clock signals. The internal clock signal ICLK is supplied to the DLL circuit 320 and thus a phase controlled internal clock signal LCLK is generated based on the received internal clock signal ICLK. The phase controlled internal clock signal LCLK is supplied to an input/output circuit and may be used as a timing signal for determining an output timing of read data.

The DLL circuit 320 may receive the ICLK signal and the RD_cmd signal. The DLL circuit 320 may include a delay line 322 and a DLL control circuit 328. The delay line 322 may include a series of adjustable delays that are configured to align a phase of the ICLK signal with a phase of the LCLK signal. The delay line 322 may a delayed version of the ICLK signal to an output as the LCLK signal. When a power is turned on, the DLL control circuit 328 may perform initialization of the measurement of a phase difference between the ICLK signal and the LCLK signal.

The DLL control circuit 328 may include a delay pointer circuit 343, a phase detector 344, a clock path replica circuit 345, and a clock counter 346. The clock path replica circuit 345 may mimic a delay for a transmission path of the ICLK signal from the DLL circuit 320 to one of a plurality of data input/output terminals of an input/output circuit. During the initialization, the phase detector 344 may detect a number of cycles of the LCLK that is longer than the inherent delay, and may accordingly set a delay pointer circuit 343 to adjust a delay of the delay line 322 to match a phase of the ICLK signal.

In parallel with determining a phase alignment of the ICLK and the LCLK, the clock counter 346 may count a total number of cycles of the ICLK signal it takes for the ICLK propagate along the propagation path through the clock path replica circuit 345. To perform this measurement, the clock counter 346 may receive the ICLK signal and may begin counting clock cycles. In parallel, the ICLK signal may propagate through the delay line 322 and the clock counter 346. Once the clock signal propagates through the clock counter 346, the 326 may provide a LoopN<X: 0> signal having a value indicating number of clock cycles it takes for the ICLK signal propagate through the delay line 322 and the clock counter 346. The LoopN<X:0> signal may be used to may control provision of a clock data output strobe enable signal (not shown).

In operation at an initial power-up, the clock counter 346 of the DLL circuit 320 may begin counting clock cycles of the ICLK signal while the ICLK signal propagates through the delay line 322 and the clock counter 346. In response to the ICLK signal propagating through the clock counter 346, the clock counter 346 may set a LoopN<x:0> signal to a value indicating a total number of clock cycles for the ICLK signal to propagate through the DLL circuit 320 to an output terminal of the input/output circuit 350.

In parallel, the phase detector 344 may perform initialization of the measurement of a phase difference between the ICLK signal and the LCLK signal. During the initialization, the clock counter 346 may include a detector that detects a number of cycles of the LCLK that is longer than the inherent delay, and may accordingly set the delay pointer circuit 343 to adjust a delay of the delay line 322 to match a phase of the ICLK signal. The delay line 322 may include a series of adjustable delays that are configured to align a phase of the ICLK signal with a phase of the LCLK signal. The delay line 322 may a delayed version of the ICLK signal to an output as the LCLK signal.

Figure 4:
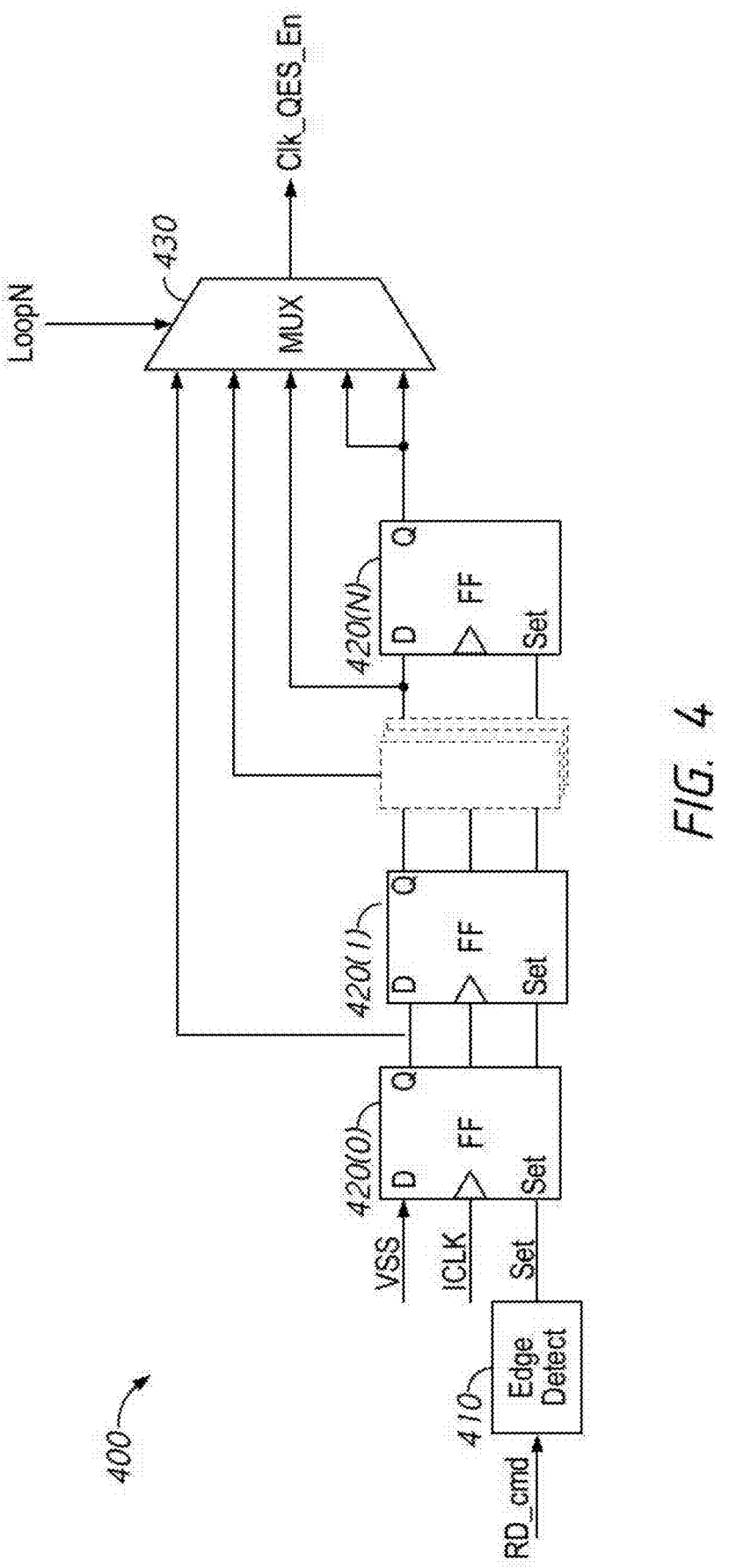
FIG. 4 is a block diagram of a clock control circuit 400 in accordance with an embodiment of the present disclosure.

FIG. 4 is a block diagram of a clock control circuit 400 in accordance with an embodiment of the present disclosure. The semiconductor device 100 of FIG. 1 and/or the semiconductor device 200 of FIG. 2 may implement the semiconductor device, in some examples. The semiconductor device clock control circuit 400 may include an edge detect circuit 410, a group of serially-coupled of flip-flops 420(0)-(N) (e.g., input D of subsequent flip-flop is coupled to output Q of preceding flip-flop), and a multiplexer 430.

The edge detect circuit 410 may be configured to receive a RD_cmd signal and upon detecting a transition of the RD_cmd signal to a logical high value, may set an output Q of each of the group of serially-coupled of flip-flops 420 (0)-(N) to a high value.

The group of serially-coupled of flip-flops 420(0)-(N) may each receive an internal clock signal ICLK and the first flip-flop 420(0) may receive a low voltage supply signal VSS (e.g., logical low value). In response to the ICLK signal, the first flip 420(0) may transition its output Q to the VSS signal value, which is coupled to the input D of the second flip-flop 420(1). In response to a second transition of the ICLK signal, the second flip-flop 420(1) may transition its output Q to the VSS signal value, which is coupled to the input D of the third flip-flop 420(2). This propagation of the VSS signal may continue through to the flip-flop 420(N).

The multiplexer 430 may include a different respective input coupled to each individual output Q of the group of serially-coupled of flip-flops 420(0)-(N). Based on a value of the LoopN signal, the multiplexer 430 may provide one of those signal to an output as a clock data output strobe (QES) enable signal Clk_QES_En. The LoopN value may be set based on propagation of the ICLK signal through a DLL circuit to an output terminal of an input/output circuit.

Figure 5:
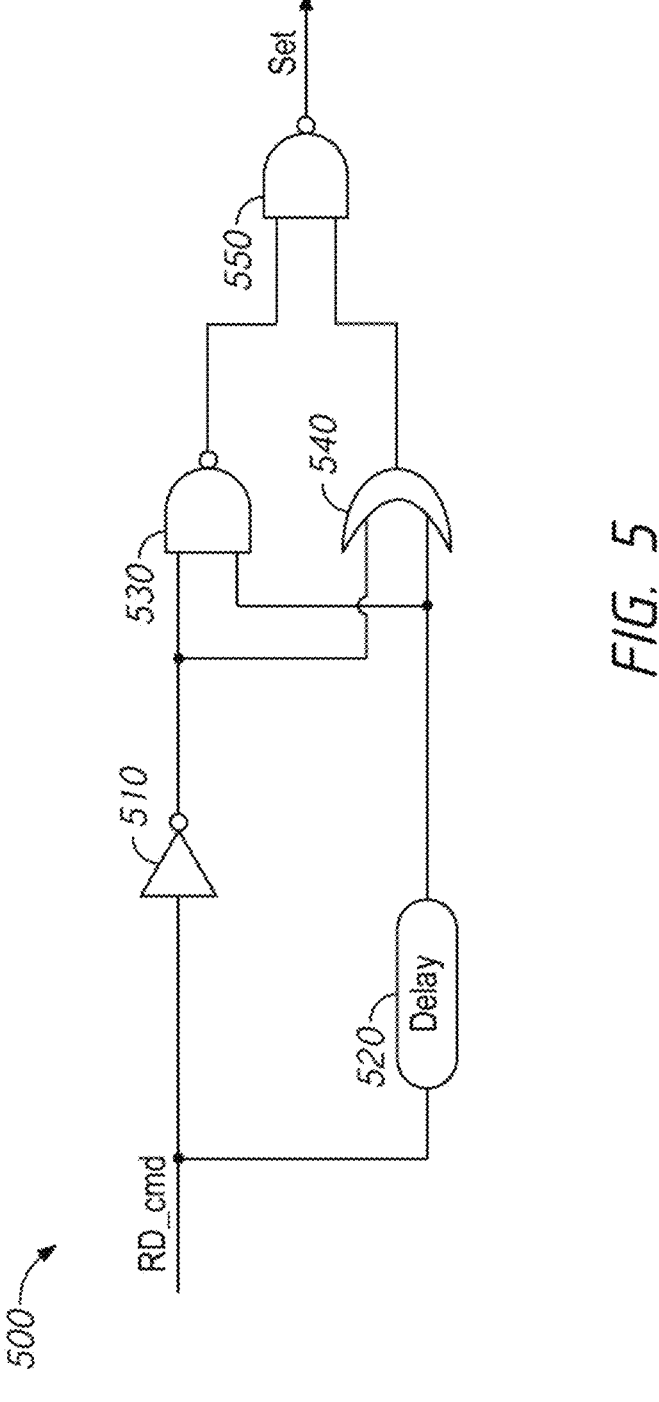
FIG. 5 is a block diagram of an edge detect circuit 500 in accordance with an embodiment of the present disclosure.

FIG. 5 is a block diagram of an edge detect circuit 500 in accordance with an embodiment of the present disclosure. The semiconductor device 100 of FIG. 1, the semiconductor device 200 of FIG. 2, and/or the clock control circuit 400 of FIG. 4 may implement the edge detect circuit 500, in some examples. The semiconductor device edge detect circuit 500 may include an inverter 510, a delay circuit 520, a NAND gate 530, an OR gate 540, and a NAND gate 550. The edge detect circuit 500 may detect an edge transition of the RD_cmd signal to provide a set signal in response to the edge detection.

The inverter 510 and the delay circuit 520 may be configured to receive a RD_cmd signal. The inverter 510 may provide an inverted version of the RD_cmd signal to the NAND gate 530 and the OR gate 540. The delay circuit 520 may provide a delayed version of the RD_cmd signal to the NAND gate 530 and the OR gate 540. Using NAND logic, the NAND gate 530 may be configured to provide a first input to the NAND gate 550 based on the outputs of the inverter 510 and the delay circuit 520. Using OR logic, the OR gate 540 may be configured to provide a second input to the NAND gate 550 based on the outputs of the inverter 510 and the delay circuit 520. Using NAND logic, the NAND gate 550 may be configured to provide the set signal based on the outputs of the NAND gate 530 and the OR gate 540.

Figure 6:
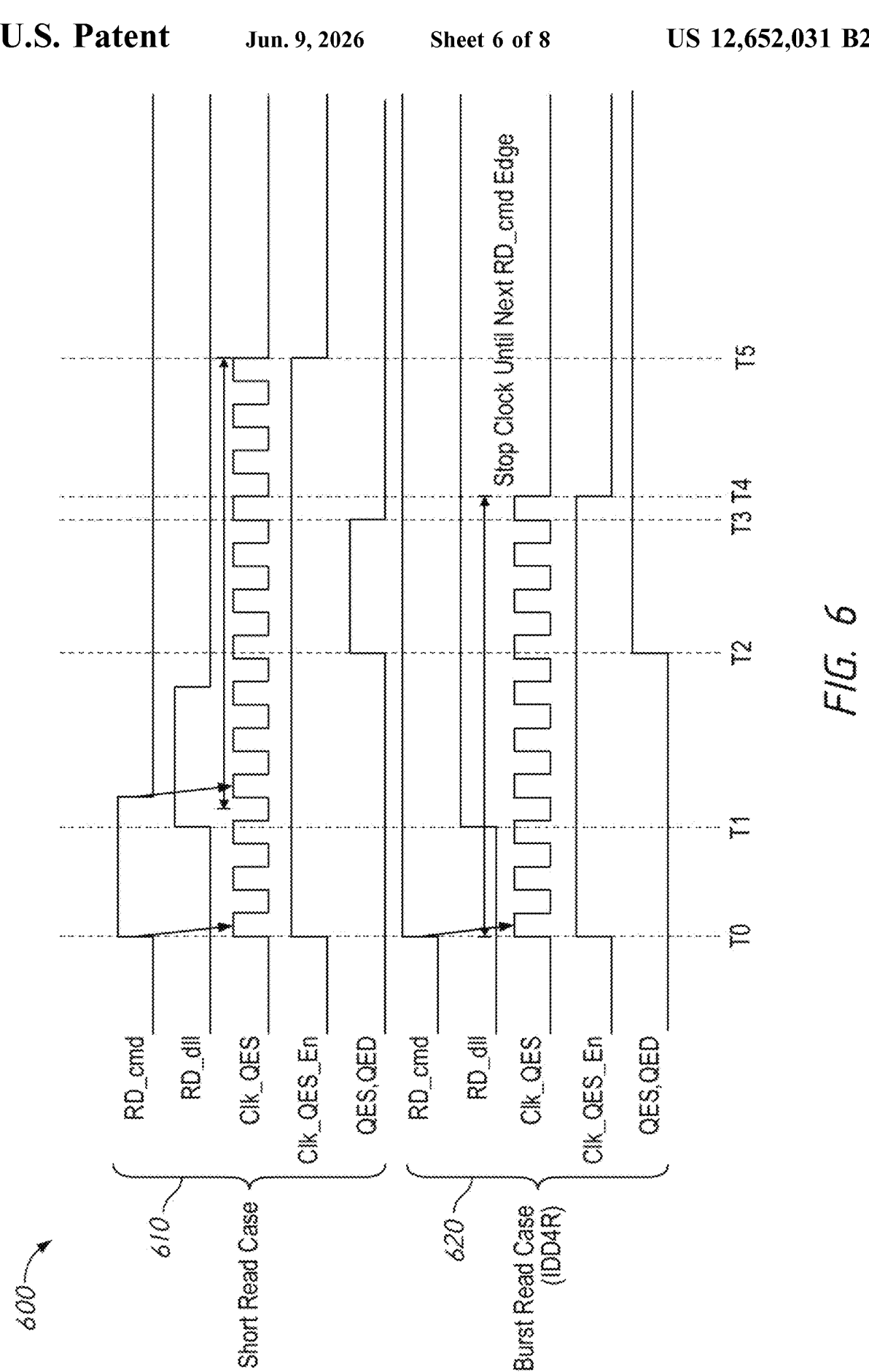
FIG. 6 is an illustration of timing diagrams 600 depicting operation of clock circuitry during a read operation in accordance with an embodiment of the present disclosure.

FIG. 6 is an illustration of timing diagrams 600 depicting operation of clock circuitry during a read operation in accordance with an embodiment of the present disclosure. The RD_cmd signal may correspond to the CMD signal of FIG. 1, the RD_cmd signals of FIGS. 2, 4, and 5, in some examples. The RD_dll signal, the Clk_QES signal, and the QES/QED signals may correspond to the RD_dll signal, the Clk_QES signal, and the QES/QED signals, respectively, of FIG. 2. The Clk_QES_En signal may correspond to the Clk_QES_En signal of FIGS. 2 and 4. The first timing diagram 610 may correspond to a short read case and the second timing diagram 620 may correspond to a burst read case (as used in DDR4). The foregoing description will apply to both the first timing diagram 610 and the second timing diagram 620, unless otherwise indicated.

At time T0, the RD_cmd signal may transition to a high value. In response, the Clk_QES_En signal may transition to the logical high value (e.g., the clock control circuit 226 of FIG. 2), and in response to the Clk_QES_En signal transitioning to the logical high value, the Clk_QES signal may begin toggling according to a clock signal (e.g., the clock enable circuit 230 of FIG. 2).

At time T1, the RD_dll signal may transition to a logical high value (e.g., the read delay line 224 of FIG. 2). At time T2, the QES, QED signals may transition to the logical high value (e.g., the QED and QES generation circuit 240 of FIG. 2).

For the first timing diagram 610, at time T3, the QES, QED signals may transition to a logical low value (e.g., short read). At time T5, the Clk_QES_En signal may transition to the logical low value, which may cause the Clk_QES signal to stop toggling (e.g., the clock enable circuit 230 of FIG. 2).

For the second timing diagram 620, at time T4, the Clk_QES_En signal may transition to the logical low value, which may cause the Clk_QES signal to stop toggling (e.g., the clock enable circuit 230 of FIG. 2) (burst read case), even though the QES/QED signals continue to remain high. In response to a subsequent RD_cmd, the Clk_QES_En signal would transition to the high low value, which may cause the Clk_QES signal to begin toggling.

The timing diagrams 600 are exemplary for illustrating operation of various described embodiments. Although the timing diagrams 600 depict a particular arrangement of signal transitions of the included signals, one of skill in the art will appreciate that additional or different transitions may be included in different scenarios without departing from the scope of the disclosure. Further, the depiction of a magnitude of the signals represented in the timing diagrams 600 are not intended to be to scale, and the representative timing is an illustrative example of a timing characteristics.

Figure 7:
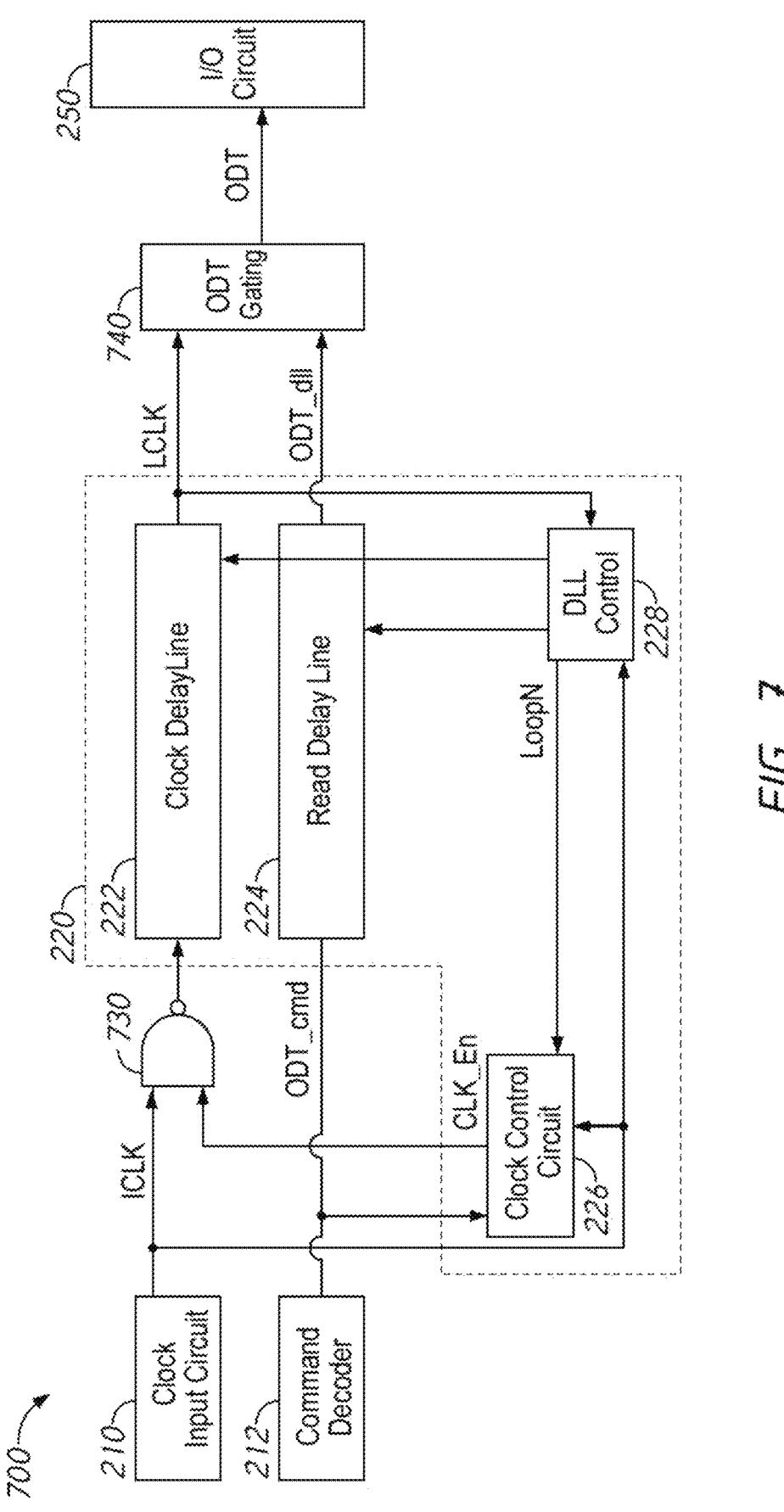
FIG. 7 is a block diagram of a semiconductor device 700 including a DLL circuit 220 in accordance with an embodiment of the present disclosure.

FIG. 7 is a block diagram of a semiconductor device 700 including a DLL circuit 220 in accordance with an embodiment of the present disclosure. The semiconductor device 100 of FIG. 1 may implement the semiconductor device 700, in some examples. The semiconductor device 700 is depicted processing an on-die termination command ODT_cmd. The semiconductor device 200 may include a clock input circuit 210, a command decoder 212, the DLL circuit 220, a clock enable circuit 730, and an ODT circuit 740, and an input/output circuit 250. The semiconductor device 700 may include elements that have been previously described with respect to the semiconductor device 200 of FIG. 2. Those elements have been identified in FIG. 7 using the same reference numbers used in FIG. 2 and operation of the common elements is as previously described. Consequently, a detailed description of the operation of these particular elements will not be repeated in the interest of brevity.

The command decoder command decoder 212 may decode the command signal to generate various internal commands including an ODT_cmd, which is propagated to the input/output circuit input/output circuit 250.

The DLL circuit 220 may receive the ICLK signal and the ODT_cmd signal. When a power is turned on, the DLL control circuit 228 may perform initialization of the measurement of a phase difference between the ICLK signal and the LCLK signal. During the initialization, the DLL control circuit 228 may include a detector that detects a number of cycles of the LCLK that is longer than the inherent delay, and may accordingly adjust a delay of the clock delay line 222 and the read delay line 224 to match a phase of the ICLK signal. In parallel with determining a phase alignment of the ICLK and the LCLK, the DLL control circuit 228 of DLL circuit 220 may measure a total number of cycles of the ICLK signal it takes for the ICLK propagate along the propagation path to the input/output circuit input/output circuit 250, and may provide the measurement as a LoopN signal.

Using the LoopN signal, the clock control circuit 226 may control provision of the clock enable signal CLK_En based on the ODT_cmd and the count value. That is, the clock control circuit 226 may set the CLK_En signal to enable in response to the ODT_cmd signal and may set the CLK_En to disable after a number of clock cycles of the ICLK exceeds the count value from the time the RD_cmd signal is received. By more tightly controlling the window, the semiconductor device 200 may consume less power than implementations where the windows are set to a fixed time or number of clock cycles regardless of device.

Rather than the clock enable circuit 230 being positioned after the clock delay line 222, as shown in FIG. 2, the clock enable circuit 730 may be positioned before the clock delay line 222 to save additional power by eliminating power used through the clock delay line 222. The clock enable circuit 730 may receive the ICLK signal and the CLK_En signal. Using NAND logic, when the CLK_En signal is enabled, the clock enable circuit 730 may provide the ICLK signal to the clock delay line 222. When the CLK_En signal is disabled, the clock enable circuit 230 may set the ICLK signal to a constant, non-periodic value. The ODT circuit 740 may control operation of the ODT signal based on the LCLK signal and the ODT_dll signal from the read delay line 224. The input/output circuit 250 may provide complete an ODT operation based on the ODT signal.

Figure 8:
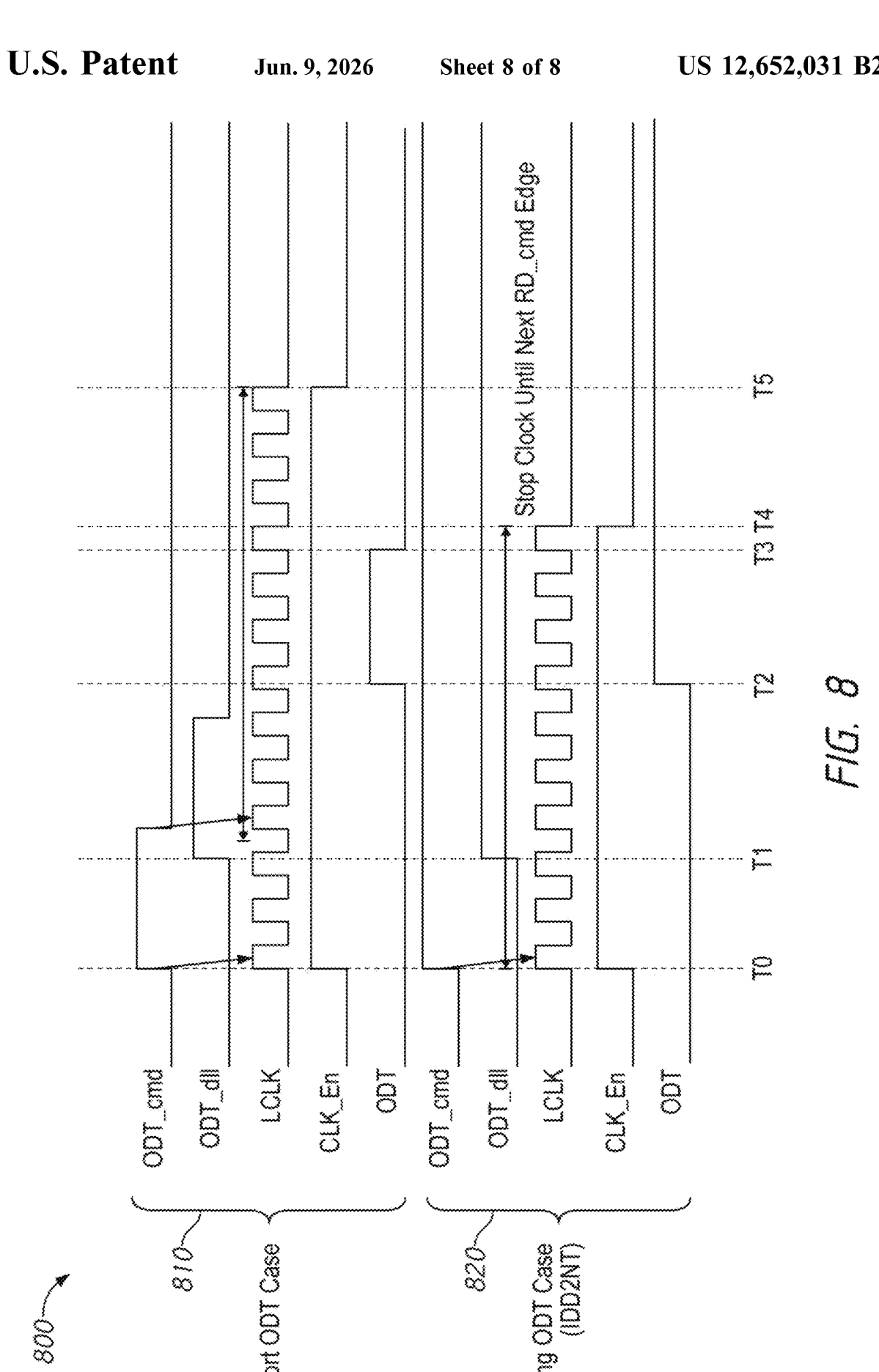
FIG. 8 is an illustration of timing diagrams 800 depicting operation of clock circuitry during an ODT operation in accordance with an embodiment of the present disclosure.

FIG. 8 is an illustration of timing diagrams 800 depicting operation of clock circuitry during an ODT operation in accordance with an embodiment of the present disclosure. The ODT_cmd, the ODT_dll, the LCLK, the Clk_EN, and the ODT signals may correspond to the ODT_cmd, the ODT_dll, the LCLK, the Clk_En, and the ODT signals, respectively, of FIG. 7. The first timing diagram 810 may correspond to a short ODT case and the second timing diagram 820 may correspond to a long ODT case. The foregoing description will apply to both the first timing diagram 810 and the second timing diagram 820, unless otherwise indicated.

At time T0, the ODT_cmd signal may transition to a high value. In response, the Clk_En signal may transition to the logical high value (e.g., the clock control circuit 226 of FIG. 7), and in response to the Clk_En signal transitioning to the logical high value, the LCLK signal may begin toggling according to a clock signal (e.g., the clock enable circuit 730 and the clock delay line 222 of FIG. 7).

At time T1, the RD_dll signal may transition to a logical high value (e.g., the read delay line 224 of FIG. 7). At time T2, the ODT signals may transition to the logical high value (e.g., the ODT circuit 740 of FIG. 7).

For the first timing diagram 810, at time T3, the QES, QED signals may transition to a logical low value (e.g., short read). At time T5, the Clk_En signal may transition to the logical low value, which may cause the LCLK signal to stop toggling (e.g., the clock enable circuit 730 and the clock delay line 222 of FIG. 7).

For the second timing diagram 820, at time T4, the Clk_En signal may transition to the logical low value, which may cause the LCLK signal to stop toggling (e.g., the clock enable circuit 730 and the clock delay line 222 of FIG. 7) (long ODT case), even though the QES/QED signals continue to remain high. In response to a subsequent ODT_cmd, the Clk_En signal would transition to the high low value, which would cause the LCLK signal to begin toggling.

The timing diagrams 800 are exemplary for illustrating operation of various described embodiments. Although the timing diagrams 800 depict a particular arrangement of signal transitions of the included signals, one of skill in the art will appreciate that additional or different transitions may be included in different scenarios without departing from the scope of the disclosure. Further, the depiction of a magnitude of the signals represented in the timing diagrams 800 are not intended to be to scale, and the representative timing is an illustrative example of a timing characteristics.

From the foregoing it will be appreciated that, although specific embodiments of the disclosure have been described herein for purposes of illustration, various modifications may be made without deviating from the spirit and scope of the disclosure. Accordingly, the disclosure is not limited except as by the appended claims.

What is claimed is:

1. An apparatus comprising:
a clock input circuit configured to provide an internal clock signal based on an external clock signal;
a command decoder configured to provide a command signal based on a received command;
an internal clock generator having a delay-locked loop (DLL) circuit configured to receive the internal clock signal and the command signal and to provide a phase-adjusted internal clock signal based on the internal clock signal, wherein, in response to receipt of the command signal, the DLL circuit is configured to enable provision of the phase-adjusted internal clock signal to an input/output circuit and to stop provision of the phase-adjusted internal clock signal after a count of clock cycles of the internal clock signal exceeds a predetermined count value, wherein the predetermined count value is based on a total signal propagation time of the internal clock signal from the output of the internal clock circuit to an output terminal of the input/output circuit.

2. The apparatus of claim 1, wherein the DLL circuit include a clock control circuit configured to count the clock cycles of the internal clock signal starting in response to receipt of the command signal and to compare the count to the predetermined count value.

3. The apparatus of claim 2, wherein the clock control circuit includes a group of serially-coupled flip-flips having respective outputs coupled to respective inputs of a multiplexer, wherein the respective outputs of the group of serially-coupled flip-flips are serially toggled in response to cycles of the internal clock signal, wherein the multiplexer is configured to provide an enable signal to control provision of the phase-adjusted internal clock signal selected from one of the respective outputs of the group of serially-coupled flip-flips based on the predetermined count value.

4. The apparatus of claim 3, wherein the clock control circuit further includes an edge detect circuit configured to set the respective outputs of each of the group of serially-coupled flip-flips to a common value in response to receipt of the command signal.

5. The apparatus of claim 1, wherein the internal clock generator includes a logic circuit configured to control provision of the phase-adjusted internal clock signal based on the enable signal.

6. The apparatus of claim 1, wherein the logic circuit includes a NAND gate configured to provide an output based on a combination of the phase the phase-adjusted internal clock signal and the enable signal.

7. The apparatus of claim 1, wherein the DLL circuit include a DLL control circuit that is configured to determine the predetermined count value during an initialization phase.

8. The apparatus of claim 1, wherein the command includes a read command.

9. An apparatus comprising:
a clock input circuit configured to receive an external clock signal and to provide an internal clock signal;
a command decoder configured to receive a command and to provide a command signal;
an internal clock generator having a delay-locked loop (DLL) circuit configured to receive the internal clock signal and the command signal and to provide the internal clock signal through a delay line to provide a phase-adjusted internal clock signal, wherein, in response to receipt of the command signal, the DLL circuit is configured to enable provision of the internal clock signal to the delay line in response to receipt of the command signal and to stop provision of the internal clock signal after a count of clock cycles of the internal clock signal exceeds a predetermined count value, wherein the predetermined count value is based on a total signal propagation time of the internal clock signal from the output of the internal clock circuit to an output terminal of an input/output circuit.

10. The apparatus of claim 9, wherein the DLL circuit include a clock control circuit configured to provide an enable signal having a value based on a comparison between the clock cycles of the internal clock signal starting in response to receipt of the command signal and the predetermined count value.

11. The apparatus of claim 10, wherein the clock control circuit includes an edge detect circuit configured to reset the count of clock cycles in response to receipt of the command signal.

12. The apparatus of claim 11, wherein the internal clock generator includes a logic circuit configured to control provision of the internal clock signal to the delay line based on the enable signal.

13. The apparatus of claim 9, wherein the DLL circuit include a DLL control circuit that is configured to determine the predetermined count value during an initialization phase.

14. The apparatus of claim 9, wherein the command includes an on-die termination command.

15. A method comprising:
receiving, at a semiconductor device, an external clock signal and a command;
in response to the external clock signal, generating an internal clock signal;
in response to the command, generating a command signal;
in response to receipt of the command signal:
enabling provision of a phase-adjusted internal clock signal generated based on the internal clock signal to an input/output circuit; and
stop provision of the phase-adjusted internal clock signal to the input/output circuit after a count of clock cycles of the internal clock signal exceeds a predetermined count value, wherein the predetermined count value is based on a total signal propagation time of the internal clock signal from the output of the internal clock circuit to an output terminal of the input/output circuit.

16. The method of claim 15, further comprising, starting in response to receipt of the command signal:

counting the clock cycles of the internal clock signal; and comparing the count of the clock cycles to the predetermined count value.

17. The method of claim 16, further comprising resetting the count of the clock cycles in response to receipt of the command signal and prior to starting the count of the clock cycles.

18. The method of claim 15, further comprising using NAND logic to control provision of the phase-adjusted clock signal to the input/output circuit.

19. The method of claim 15, further comprising determining the predetermined count value during an initialization phase.

20. The method of claim 15, wherein the command includes a read command.

\* \* \* \* \*